United States Patent
Antoni et al.

(10) Patent No.: US 7,142,285 B2
(45) Date of Patent: Nov. 28, 2006

(54) ILLUMINATION SYSTEM PARTICULARLY FOR MICROLITHOGRAPHY

(75) Inventors: Martin Antoni, Aalen (DE); Wolfgang Singer, Aalen (DE); Johannes Wangler, Königsbronn (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/381,827

(22) PCT Filed: Sep. 28, 2001

(86) PCT No.: PCT/EP01/11248

§ 371 (c)(1),
(2), (4) Date: Aug. 7, 2003

(87) PCT Pub. No.: WO02/27401

PCT Pub. Date: Apr. 4, 2002

(65) Prior Publication Data

Related U.S. Application Data

(63) Continuation-in-part of application No. 09/679,718, filed on Sep. 29, 2000, now Pat. No. 6,438,199, which is a continuation-in-part of application No. 09/305,017, filed on May 4, 1999, now Pat. No. 6,198,793.

(30) Foreign Application Priority Data

| May 5, 1998 | (DE) | ................................. 198 19 898 |
| Feb. 2, 1999 | (DE) | ................................. 199 03 807 |
| Feb. 8, 1999 | (DE) | ........................... 299 02 108 U |
| Jul. 28, 2000 | (EP) | ..................... PCT/EP 00/07258 |

(51) Int. Cl.
*G03B 27/54* (2006.01)
*G03B 27/42* (2006.01)
*G21K 5/04* (2006.01)

(52) U.S. Cl. .............................. 355/67; 355/53; 378/34
(58) Field of Classification Search .................. 355/53, 355/55, 67–71; 378/34; 359/624, 366, 859
See application file for complete search history.

(56) References Cited

U.S. PATENT DOCUMENTS 4,195,913 A    4/1980   Dourte et al. ............... 350/292

(Continued)

FOREIGN PATENT DOCUMENTS

DE          199 03 807 A1     2/1999

(Continued)

OTHER PUBLICATIONS

European Search Report, dated May 12, 2004.

(Continued)

*Primary Examiner*—Henry Hung Nguyen
(74) *Attorney, Agent, or Firm*—Ohlandt, Greeley, Ruggiero & Perle, L.L.P.

(57) ABSTRACT

There is provided an illumination system for microlithography with wavelengths $\leq 193$ nm. The illumination system includes a primary light source, a first optical component, a second optical component, an image plane, and an exit pupil. The first optical component transforms the primary light source into a plurality of secondary light sources that are imaged by the second optical component in the exit pupil. The first optical component includes a first optical element having a plurality of first raster elements that are imaged into the image plane producing a plurality of images being superimposed at least partially on a field in the image plane. The first raster elements that are imaged into the image plane are illuminated almost completely.

19 Claims, 8 Drawing Sheets

U.S. PATENT DOCUMENTS

| | | | |
|---|---|---|---|
| 4,294,538 A | 10/1981 | Ban | 355/51 |
| 4,389,115 A | 6/1983 | Richter | 355/26 |
| 4,651,012 A | 3/1987 | Clark et al. | 250/505.1 |
| 4,688,932 A | 8/1987 | Suzuki | 355/51 |
| 4,740,276 A | 4/1988 | Marmo et al. | 204/7 |
| 5,071,240 A | 12/1991 | Ichihara et al. | 359/366 |
| 5,148,442 A | 9/1992 | O'Neill | 372/71 |
| 5,222,112 A | 6/1993 | Terasawa et al. | 378/34 |
| 5,339,346 A | 8/1994 | White | 378/34 |
| 5,353,322 A | 10/1994 | Bruning et al. | 378/34 |
| 5,361,292 A | 11/1994 | Sweatt | 378/34 |
| 5,402,267 A | 3/1995 | Furter et al. | 359/727 |
| 5,439,781 A | 8/1995 | MacDowell et al. | 430/311 |
| 5,440,423 A | 8/1995 | Ogura | 359/365 |
| 5,459,547 A | 10/1995 | Shiozawa | 355/67 |
| 5,499,282 A | 3/1996 | Silfvast | 378/119 |
| 5,512,759 A | 4/1996 | Sweatt | 250/492.1 |
| 5,581,605 A | 12/1996 | Murakami et al. | 378/84 |
| 5,594,526 A | 1/1997 | Mori et al. | 355/67 |
| 5,644,383 A | 7/1997 | Mori | 355/68 |
| 5,647,664 A | 7/1997 | Hanecka | 362/308 |
| 5,669,708 A | 9/1997 | Mashima et al. | 362/341 |
| 5,677,939 A | 10/1997 | Oshino | 378/34 |
| 5,715,084 A | 2/1998 | Takahashi et al. | 359/487 |
| 5,737,137 A | 4/1998 | Cohen et al. | 359/859 |
| 5,755,503 A | 5/1998 | Chen et al. | 353/38 |
| 5,796,524 A | 8/1998 | Oomura | 359/633 |
| 5,805,356 A | 9/1998 | Chiba | 359/727 |
| 5,846,678 A | 12/1998 | Nishigori et al. | 430/30 |
| 5,896,438 A | 4/1999 | Miyake et al. | 378/34 |
| 5,963,305 A | 10/1999 | Mizouchi | 355/67 |
| 5,993,010 A | 11/1999 | Ohzawa et al. | 353/99 |
| 5,995,582 A | 11/1999 | Terashima et al. | 378/34 |
| 6,057,899 A | 5/2000 | Tanaka et al. | 349/95 |
| 6,081,319 A | 6/2000 | Ozawa et al. | 355/67 |
| 6,198,793 B1 | 3/2001 | Schultz et al. | 378/34 |
| 6,208,707 B1 | 3/2001 | Oshino | 378/34 |
| 6,229,647 B1 | 5/2001 | Takahashi et al. | 359/487 |
| 6,285,443 B1 * | 9/2001 | Wangler et al. | 355/67 |
| 6,339,467 B1 | 1/2002 | Sato | 355/77 |
| 6,400,794 B1 * | 6/2002 | Schultz et al. | 378/34 |
| 6,438,199 B1 | 8/2002 | Schultz et al. | 378/34 |
| 6,545,272 B1 | 4/2003 | Kondo | 250/305 |
| 6,570,168 B1 * | 5/2003 | Schultz et al. | 250/492.2 |
| 6,573,978 B1 | 6/2003 | McGuire, Jr. | 355/71 |
| 6,583,937 B1 * | 6/2003 | Wangler et al. | 359/624 |
| 6,594,334 B1 | 7/2003 | Ota | 378/34 |
| RE38,438 E | 2/2004 | Takahashi | 359/727 |

FOREIGN PATENT DOCUMENTS

| | | |
|---|---|---|
| EP | 0066295 | 12/1982 |
| EP | 0359018 A2 | 3/1990 |
| EP | 0779558 A2 | 6/1997 |
| EP | 0939341 | 9/1999 |
| EP | 0 955 641 A1 | 11/1999 |
| EP | 1026547 | 8/2000 |
| EP | 1 067 437 | 1/2001 |

OTHER PUBLICATIONS

Article "Handbook On Synchroton Radiation" Ernst-Eckhard Koch., pp. 140-145, 1098-1111 (1983).

Article by Murphy, et al. "Synchrotron Radiation Sources and Condensers For Projection X-ray Lithography" Applied Optics, vol. 32, No. 34, pp. 6920-6929 (Dec. 1, 1993).

* cited by examiner

ILLUMINATION SYSTEM PARTICULARLY FOR MICROLITHOGRAPHY

CROSS-REFERENCE TO RELATED APPLICATIONS

The present application is a U.S. national stage entry of International Application No. PCT/EP01/11248, filed Sep. 28, 2001, which is a continuation-in-part of U.S. patent application Ser. No. 09/679,718, filed Sep. 29, 2000 now U.S. Pat. No. 6,438,199, which is a continuation-in-part of U.S. patent application Ser. No. 09/305,017, filed May 4, 1999 now U.S. Pat. No. 6,198,793.

BACKGROUND OF THE INVENTION

1. Field of the Invention

The invention concerns an illumination system for wavelengths ≦193 nm as well as a projection exposure apparatus with such an illumination system.

2. Description of the Related Art

In order to be able to further reduce the structural widths of electronic components, particularly in the submicron range, it is necessary to reduce the wavelengths of the light utilized for microlithography. Lithography with very deep UV radiation, so called VUV (Very deep UV) lithography or with soft x-ray radiation, so-called EUV (extreme UV) lithography, is conceivable at wavelengths smaller than 193 nm, for example.

An illumination system for a lithographic device, which uses EUV radiation, has been made known from U.S. Pat. No. 5,339,346. For uniform illumination in the reticle plane and filling of the pupil, U.S. Pat. No. 5,339,346 proposes a condenser, which is constructed as a collector lens and comprises at least 4 pairs of mirror facets, which are arranged symmetrically. A plasma light source is used as the light source.

In U.S. Pat. No. 5,737,137, an illumination system with a plasma light source comprising a condenser mirror is shown, in which an illumination of a mask or a reticle to be illuminated is achieved by means of spherical mirrors.

U.S. Pat. No. 5,361,292 shows an illumination system, in which a plasma light source is provided, and the point plasma light source is imaged in an annular illuminated surface by means of a condenser, which has five aspherical mirrors arranged off-center.

From U.S. Pat. No. 5,581,605, an illumination system has been made known, in which a photon beam is split into a multiple number of secondary light sources by means of a plate with concave raster elements. In this way, a homogeneous or uniform illumination is achieved in the reticle plane. The imaging of the reticle on the wafer to be exposed is produced by means of a conventional reduction optics.

EP-A-0 939 341 shows an illumination system and exposure apparatus for illuminating a surface over an illumination field having an arcuate shape with x-ray wave length light. The illumination system comprises first and second optical integrators each with a plurality of reflecting elements. The first and second optical integrators being opposingly arranged such that a plurality of light source images are formed at the plurality of reflecting elements of the second optical integrator. To form an arcuate shaped illumination field in the field plane according to EP-A-0 939 341 the reflecting elements of the first optical integrator have an arcuate shape similar to the arcuate illumination field. Such reflecting elements are complicate to manufacture.

EP-A-1 026 547 also shows an illumination system with two optical integrators. Similar to the system of EP-A-0 939 341 reflecting elements of the first optical integrator have an arcuate shape for forming an arcuate shaped illumination field in the field plane.

In EP-A-0 955 641 a system with two optical integrators is shown. Each of said optical integrators comprises a plurality of raster-elements. The raster elements of the first optical integrator are of rectangular shape. The arc-shaped field in the field plane is formed by at least one grazing incidence field mirror.

The content of the above mentioned patent-applications are incorporated by reference.

SUMMARY OF THE INVENTION

It is an object of the invention to overcome the disadvantages of the illumination systems according to the state of art and to provide an illumination system for microlithography that fulfills the requirements for advanced lithography with wavelength less or equal to 193 nm. The illumination system should provide a uniform illumination of the field in the image plane of the illumination system. Preferably the specification of the uniformity of the light intensity after scanning of the field should be lower than ±5%, most preferably lower than ±0,5%. The uniformity of the light intensity after scanning of the field is called scanning integrated uniformity.

The object of the invention is solved by an illumination system with the features of claim 1 and a projection exposure apparatus with the features of claim 16.

The system illuminates a structured reticle arranged in the image plane of the illumination system, which will be imaged by a projection objective onto a light sensitive substrate. The shape of the field is dependent on the type of projection objective. All reflective projection objectives typically have an arc-shaped field, which is given by a segment of an annulus. A further requirement is the illumination of the exit pupil of the illumination system, which is located at the entrance pupil of the projection objective. A nearly field-independent illumination of the exit pupil is required.

Typical light sources for wavelengths between 100 nm and 200 nm are excimer lasers, for example an ArF-Laser for 193 nm, an $F_2$-Laser for 157 nm, an $Ar_2$-Laser for 126 nm and an NeF-Laser for 109 nm. For systems in this wavelength region refractive components of $SiO_2$, $CaF_2$, $BaF_2$ or other crystallites are used. Since the transmission of the optical materials deteriorates with decreasing wavelength, the illumination systems are designed with a combination of refractive and reflective components. For wavelengths in the EUV wavelength region, between 10 nm and 20 nm, the projection exposure apparatus is designed as all-reflective. A typical EUV light source is a Laser-Produced-Plasma-source, a Pinch-Plasma-Source, a Wiggler-Source or an Undulator-Source.

The light of this primary light source is directed to a first optical element, wherein the first optical element is part of a first optical component. Preferably the first optical component comprises a collector unit. The collector unit collects the light of the primary light source. The first optical element is organized as a plurality of first raster elements and transforms, preferably together with the collector unit, the primary light source into a plurality of secondary light sources. Each first raster element corresponds to one secondary light source-and focuses an incoming ray bundle, defined by all rays intersecting the first raster element, to the corresponding secondary light source. The secondary light sources are arranged in a pupil plane of the illumination system or nearby this plane. A field lens forming a second optical component is arranged between the pupil plane and the image plane of the illumination system to image the secondary light sources into an exit pupil of the illumination system, which corresponds to the entrance pupil of a following projection objective.

The first raster elements are imaged into the image plane, wherein their images are at least partially superimposed on a field that must be illuminated. Therefore, they are known as field raster elements or field honeycombs.

To achieve a uniform illumination of the field in the image plane according to the invention only field raster elements are imaged into the image plane, which are illuminated almost completely. Preferably only such first raster elements are imaged into the image plane which are illuminated for more than 95%. In one embodiment of the invention this can be realized with a masking unit in front of the plate with the field raster elements. A masking unit in front of the plate with field raster elements has the further advantage that the heat load on the field raster elements is reduced. Alternatively the field raster elements could be distributed on the plate supporting the field raster elements such that at least 90% of the field raster elements are completely illuminated.

If the light source is a point-like source, the secondary light sources are also point-like. In this case the imaging of each of the field raster elements can be explained visually with the principle of a "camera obscura", with the small hole of the camera obscura at the position of each corresponding secondary light source, respectively.

To superimpose the images of the field raster elements in the image plane of the illumination system the incoming ray bundles are deflected by the field raster elements with first deflection angles, which are not equal for each of the field raster elements but at least different for two of the field raster elements. Therefore individual deflection angles for the field raster elements are designed. This gives a further possibility achieve the object of the invention. For field raster elements which are not almost completely illuminated the deflection angle could be choosen such that the deflected ray bundle does not impinge the image plane within the field to be illuminated in this plane.

For each field raster element a plane of incidence is defined by the incoming and deflected centroid ray selected from the incoming ray bundle. Due to the individual deflection angles, at least two of the incidence planes are not parallel.

In advanced microlithography systems the light distribution in the entrance pupil of a projection objective must fulfill special requirements such as having an overall shape or uniformity. Since the secondary light sources are imaged into the exit pupil, their arrangement in the pupil plane of the illumination system determines the light distribution in the exit pupil. With the individual deflection angles of the field raster elements a predetermined arrangement of the secondary light sources can be achieved, independent of the directions of the incoming ray bundles.

For reflective field raster elements the deflection angles are generated by the tilt angles of the field raster elements. The tilt axes and the tilt angles are determined by the directions of the incoming ray bundles and the positions of the secondary light sources, to which the reflected ray bundles are directed.

For refractive field raster element the deflection angles are generated by lenslets, which have a prismatic optical power. The refractive field raster elements can be lenslets with an optical power having a prismatic contribution or they can be a combination of a single prism and a lenslet. The prismatic optical power is determined by the directions of the incoming ray bundles and the positions of the corresponding secondary light sources.

Given the individual deflection angles of the first raster elements, the beam path to the plate with the raster elements can be either convergent or divergent. The slope values of the field raster elements at the centers of the field raster elements has then to be similar to the slope values of a surface with negative power to reduce the convergence of the beam path, or with positive power to increase the divergence of the beam path. Finally the field raster elements deflect the incoming ray bundles to the corresponding secondary light sources having predetermined positions depending on the illumination mode of the exit pupil.

The diameter of the beam path is preferably reduced after the collector unit to arrange filters or transmission windows with a small size. This is possible by imaging the light source with the collector unit to an intermediate image. The intermediate image is arranged between the collector unit and the plate with the field raster elements. After the intermediate image of the light source, the beam path diverges. An additional mirror to condense the diverging rays is not necessary due to the field raster elements having deflecting optical power For contamination reasons there is a free working distance between the light source and the collector unit, which results in considerable diameters for the optical components of the collector unit and also for the light beam. Therefore the collector unit has positive optical power to generate a converging ray bundle to reduce the beam diameter and the size of the plate with field raster elements. The convergence of the light rays can be reduced with the field raster elements, if the deflection angles are designed to represent a negative optical power For the centroid rays impinging on the centers of the field raster elements, the collector unit and the plate with the field raster elements then form a telescope system. The collector unit has positive optical power to converge the centroid rays towards the optical axis, wherein the field raster elements reduce the converging angles of the centroid rays with this telescope system the track length of the illumination system can be reduced.

Preferably, the field raster elements are tilted planar mirrors or prisms with planar surfaces, which are much easier to produce and to qualify than curved surfaces. This is possible, if the collector unit is designed to image the primary light source into the pupil plane of the illumination system, which would result in one secondary light source, if the field raster elements were omitted. The plurality of secondary light sources is generated by the plurality of field raster elements, which distribute the secondary light sources in the pupil plane according to their deflection angles. The positive optical power to focus the incoming ray bundles to the secondary light sources is completely provided by the collector unit. Therefore the optical distance between the image-side principal plane of the collector unit and the image plane of the collector unit is nearly given by the sum of the optical distance between the image-side principal plane of the collector unit and the plate with the field raster elements, and the optical distance between the plate with the field raster elements and the pupil plane of the illumination system. Due to the planar surfaces, the field raster elements do not influence the imaging of the primary light source into one secondary light source, except for the dividing of this one secondary light source into a plurality of secondary light sources due to the deflection angles. For point-like or spherical sources the collector unit has ellipsoidal mirrors or conical lenses with a first and second focus, wherein the primary light source is arranged in the first focus, and the secondary light source is arranged in the second focus of the collector unit.

If the focusing power of the collector unit is large and the primary light source is imaged in front of the pupil plane, the field raster elements have negative optical power. The field raster elements with negative optical power are convex mirrors in case of reflective systems or lenslets comprising negative optical power in case of refractive system to generate the secondary light sources in or nearby the pupil plane.

If the focusing power of the collector unit is low and the primary light source is imaged behind the pupil plane, the field raster elements have positive optical power.

The field raster elements with positive optical power are concave mirrors in case of reflective systems or lenslets comprising positive optical power in case of refractive system to generate the secondary light sources in or nearby the pupil plane.

The field raster elements are preferably arranged in a two-dimensional array on a plate without overlapping. For reflective field raster elements the plate can be a planar plate or a curved plate. To minimize the light losses between adjacent field raster elements they are arranged only with intermediate spaces between them, which are necessary for the mountings of the field raster elements. Preferably, the field raster elements are arranged in a plurality of rows having at least one field raster element and being arranged among each another. In the rows the field raster elements are put together at the smaller side of the field raster elements. At least two of these rows are displaced relative to one another in the direction of the rows. In one embodiment each row is displaced relative to the adjacent row by a fraction of a length of the field raster elements to achieve a regular distribution of the centers of the field raster elements. The fraction is dependent on the sid aspect ratio and is preferably equal to the square root of the length of one field raster element In another embodiment the rows are displaced in such a way that the field raster elements are illuminated almost completely.

It is advantageous to insert a second optical element with second raster elements in the light path after the first optical element with first raster elements, wherein each first raster element corresponds to one of the second raster elements. Therefore, the deflection angles of the first raster elements are designed to deflect the ray bundles impinging on the first raster elements to the corresponding second raster elements. To achieve the object of the invention the deflection angle of the first raster elements which are not illuminated almost completely could be choosen such, that the deflected ray bundles do not impinge any of the second raster elements.

The second raster elements are preferably arranged at the secondary light sources and are designed to image together with the field lens the first raster elements or field raster elements into the image plane of the illumination system, wherein the images of the field raster elements are at least partially superimposed. The second raster elements are called pupil raster elements or pupil honeycombs. To avoid damaging of the second raster elements due to the high intensity at the secondary light sources, the second raster elements are preferably arranged defocused of the secondary light sources, but in a range from 0 mm to 10% of the distance between the first and second raster elements.

For extended secondary light sources the pupil raster elements preferably have a positive optical power to image the corresponding field raster elements, which are arranged optically conjugated to the image plane. The pupil raster elements are concave mirrors or lenslets with positive optical power.

The pupil raster elements deflect incoming ray bundles impinging on the pupil raster elements with second deflection angles in such a way that the images of the field raster elements in the image plane are at least partially superimposed. This is the case if a ray intersecting the field raster element and the corresponding pupil raster element in their centers intersects the image plane in the center of the illuminated field or nearby the center. Each pair of a field raster element and a corresponding pupil raster element forms a light channel.

The second deflection angles are not equal for each pupil raster element They are preferably individually adapted to the directions of the incoming ray bundles and the requirement to superimpose the images of the field raster elements at least partially in the image plane.

With the tilt axis and the tilt angle for a reflective pupil raster element or with the prismatic optical power for a refractive pupil raster element the second deflection angle can be individually adapted.

For point-like secondary light sources the pupil raster elements only have to deflect the incoming ray bundles without focusing the rays. Therefore the pupil raster elements are preferably designed as tilted planar mirrors or prisms.

If both, the field raster elements and the pupil raster elements deflect incoming ray bundles in predetermined directions, the two-dimensional arrangement of the field raster elements can be made different from the two-dimensional arrangement of the pupil raster elements. Wherein the arrangement of the field raster elements is adapted to the illuminated area on the plate with the field raster elements, the arrangement of the pupil raster elements is determined by the kind of illumination mode required in the exit pupil of the illumination system. So the images of the secondary light sources can be arranged in a circle, but also in an annulus to get an annular illumination mode or in four decentered segments to get a Quadrupol illumination mode. The aperture in the image plane of the illumination system is approximately defined by the quotient of the half diameter of the exit pupil of the illumination system and the distance between the exit pupil and the image plane of the illumination system. Typical apertures in the image plane of the illumination system are in the range of 0.02 and 0.1. By deflecting the incoming ray bundles with the field and pupil raster elements a continuous light path can be achieved. It is also possible to assign each field raster element to any of the pupil raster elements. Therefore the light channels can be mixed to minimize the deflection angles or to redistribute the intensity distribution between the plate with the field raster elements and the plate with the pupil raster elements.

Imaging errors such as distortion introduced by the field lens can be compensated for with the pupil raster elements being arranged at or nearby the secondary light sources. Therefore the distances between the pupil raster elements are preferably irregular. The distortion due to tilted field mirrors for example is compensated for by increasing the distances between the pupil raster elements in a direction perpendicular to the tilt axis of the field mirrors. Also, the pupil raster elements are arranged on curved lines to compensate for the distortion due to a field mirror, which transforms the rectangular image field to a segment of an annulus by conical reflection. By tilting the field raster elements the secondary light sources can be positioned at or nearby the distorted grid of the corresponding pupil raster elements.

For reflective field and pupil raster elements the beam path has to be folded at the plate with the field raster elements and at the plate with the pupil raster elements to avoid vignetting. Typically, the folding axes of both plates are almost parallel. Another requirement for the design of the illumination system is to minimize the incidence angles on the reflective field and pupil raster elements. Therefore the folding angles have to be as small as possible. This can be achieved if the extent of the plate with the field raster elements is approximately equal to the extent of the plate with the pupil raster elements in a direction perpendicular to the direction of the folding axes, or if it differs less than ±10%.

Since the secondary light sources are imaged into the exit pupil of the illumination system, their arrangement determines the illumination mode of the pupil illumination. Typically the overall shape of the illumination in the exit pupil is circular and the diameter of the illuminated region is in the order of 60%–80% of the diameter of the entrance pupil of the projection objective. The diameters of the exit pupil of the illumination system and the entrance pupil of the projection objective are in another embodiment preferably equal. In such a system the illumination mode can be changed in a wide range by inserting masking blades at the plane with the secondary light sources to get a conventional, Dipol or Quadrupol illumination of the exit pupil.

All-reflective projection objectives used in the EUV wavelength region have typically an object field being a segment of an annulus. Therefore the field in the image plane of the illumination system in which the images of the field raster elements are at least partially superimposed has preferably the same shape. The shape of the illuminated field can be generated by the optical design of the components or by masking blades which have to be added nearby the image plane or in a plane conjugated to the image plane.

The field raster elements are preferably rectangular. Rectangular field raster elements have the advantage that they can be arranged in rows being displaced against each other. Depending on the field to be illuminated they have a side aspect ratio in the range of 5:1 and 20:1. The length of the rectangular field raster elements is typically between 15 mm and 50 mm, the width is between 1 mm and 4 mm.

To illuminate an arc-shaped field in the image plane with rectangular field raster elements the field lens preferably comprises a first field mirror for transforming the rectangular images of the rectangular field raster elements to arc-shaped images. The arc length is typically in the range of 80 mm to 105 mm, the radial width in the range of 5 mm to 9 mm. The transformation of the rectangular images of the rectangular field raster elements can be done by conical reflection with the first field mirror being a grazing incidence mirror with negative optical power. In other words, the imaging of the field raster elements is distorted to get the arc-shaped images, wherein the radius of the arc is determined by the shape of the object field of the projection objective. The first field mirror is preferably arranged in front of the image plane of the illumination system, wherein there should be a free working distance. For a configuration with a reflective reticle the free working distance has to be adapted to the fact that the rays traveling from the reticle to the projection objective are not vignetted by the first field mirror.

The surface of the first field mirror is preferably an off-axis segment of a rotational symmetric reflective surface, which can be designed aspherical or spherical. The axis of symmetry of the supporting surface goes through the vertex of the surface. Therefore a segment around the vertex is called on-axis, wherein each segment of the surfaces which does not include the vertex is called off-axis. The supporting surface can be manufactured more easily due to the rotational symmetry. After producing the supporting surface the segment can be cut out with well-known techniques.

The surface of the first field mirror can also be designed as an on-axis segment of a toroidal reflective surface. Therefore the surface has to be processed locally, but has the advantage that the surrounding shape can be produced before surface treatment.

The incidence angles of the incoming rays with respect to the surface normals at the points of incidence of the incoming rays on the first field mirror are preferably greater than 70°, which results in a reflectivity of the first field mirror of more than 80%.

The field lens comprises preferably a second field mirror with positive optical power. The first and second field mirror together image the secondary light sources or the pupil plane respectively into the exit pupil of the illumination system, which is defined by the entrance pupil of the projection objective. The second field mirror is arranged between the plane with the secondary light sources and the first field mirror.

The second field mirror is preferably an off-axis segment of a rotational symmetric reflective surface, which can be designed aspherical or spherical, or an on-axis segment of a toroidal reflective surface.

The incidence angles of the incoming rays with respect to the surface normals at the points of incidence of the incoming rays on the second field mirror are preferably lower than 25°. Since the mirrors have to be coated with multilayers for the EUV wavelength region, the divergence and the incidence angles of the incoming rays are preferably as low as possible to increase the reflectivity, which should be better than 65%. With the second field mirror being arranged as a normal incidence mirror the beam path is folded and the illumination system can be made more compact.

By definition all rays intersecting the field in the image plane have to go through the exit pupil of the illumination system. The position of the field and the position of the exit pupil are defined by the object field and the entrance pupil of the projection objective. For some projection objectives being centered systems the object field is arranged off-axis of an optical axis, wherein the entrance pupil is arranged on-axis in a finite distance to the object plane. For these projection objectives an angle between a straight line from the center of the object field to the center of the entrance pupil and the surface normal of the object plane can be defined. This angle is in the range of 3° to 10° for EUV projection objectives. Therefore the components of the illumination system have to be configured and arranged in such a way that all rays intersecting the object field of the projection objective are going through the entrance pupil of the projection objective being decentered to the object field. For projection exposure apparatus with a reflective reticle all rays intersecting the reticle needs to have incidence angles greater than 0° to avoid vignetting of the reflected rays at components of the illumination system.

In the EUV wavelength region all components are reflective components, which are arranged preferably in such a way, that all incidence angles on the components are lower than 25° or greater than 65°. Therefore polarization effects arising for incidence angles around an angle of 45° are minimized. Since grazing incidence mirrors have a reflectivity greater than 80%, they are preferable in the optical design in comparison to normal incidence mirrors with a reflectivity greater than 65%.

The illumination system is typically arranged in a mechanical box. By folding the beam path with mirrors the overall size of the box can be reduced. This box preferably does not interfere with the image plane, in which the reticle and the reticle supporting system are arranged. Therefore it is advantageous to arrange and tilt the reflective components in such a way that all components are completely arranged on one side of the reticle. This can be achieved if the field lens comprises only an even number of normal incidence mirrors.

The illumination system as described before can be used preferably in a projection exposure apparatus comprising the illumination system, a reticle arranged in the image plane of the illumination system and a projection objective to image the reticle onto a wafer arranged in the image plane of the projection objective. Both, reticle and wafer are arranged on a support unit, which allows the exchange or scan of the reticle or wafer.

The projection objective can be a catadioptric lens, as known from U.S. Pat. No. 5,402,267 for wavelengths in the range between 100 nm and 200 nm. These systems have typically a transmission reticle.

For the EUV wavelength range the projection objectives are preferably all-reflective systems with four to eight mirrors as known for example from U.S. Ser. No. 09/503,640 showing a six mirror projection lens. These systems have typically a reflective reticle.

For systems with a reflective reticle the illumination beam path between the light source and the reticle and the projection beam path between the reticle and the wafer preferably interfere only nearby the reticle, where the incoming and reflected rays for adjacent object points are traveling in the same region. If there are no further crossing of the illumination and projection beam path it is possible to separate the illumination system and the projection objective except for the reticle region.

The projection objective has preferably a projection beam path between said reticle and the first imaging element which is tilted toward the optical axis of the projection objective. Especially for a projection exposure apparatus with a reflective reticle the separation of the illumination system and the projection objective is easier to achieve.

BRIEF DESCRIPTION OF THE DRAWINGS

The invention will be described below on the basis of drawings.

Here.

DESCRIPTION OF THE INVENTION

Figure 1:
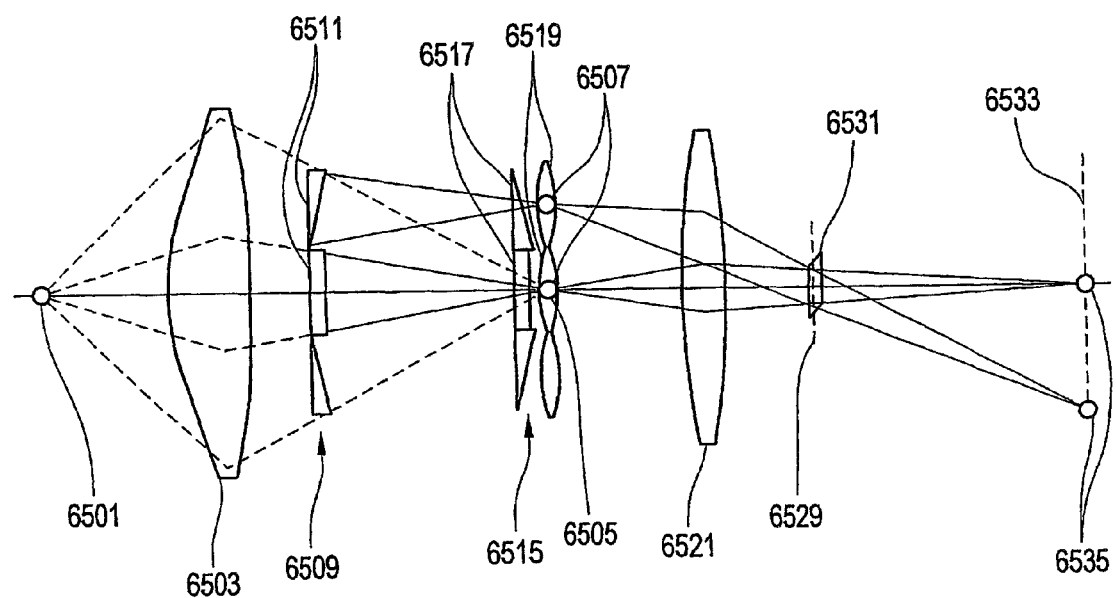
FIG. 1: A schematic view of a refractive embodiment with prisms as field raster elements.

To explain the effect of prismatic first raster elements FIG. 1 depicts a purely refractive system in a schematically view. The beam cone of the light source 6501 is collected by the aspherical collector lens 6503 and is directed to the plate with the field raster elements 6509. The collector lens 6503 is designed to generate an image 6505 of the light source 6501 at the plate with the pupil raster elements 6515 as shown with the dashed lines if the plate with the field raster elements 6509 is not in the beam path. Therefore without the plate with the field raster elements 6509 one secondary light source 6505 would be produced at the plate with the pupil raster elements. This imaginary secondary light source 6505 is divided into a plurality of secondary light sources 6507 by the field raster elements 6509 formed as field prisms 6511. The arrangement of the secondary light sources 6507 at the plate with the pupil raster elements 6515 is produced by the deflection angles of the field prisms 6511. These field prisms 6511 have rectangular surfaces and generate rectangular light bundles. However, they can have any other shape. The pupil raster elements 6515 are arranged nearby each of the secondary light sources 6507 to image the corresponding field raster elements 6509 into the reticle plane 6529 and to superimpose the rectangular images of the field raster elements 6509 in the field 6531 to be illuminated. The pupil raster elements 6515 are designed as combinations of a pupil prism 6517 and a pupil lenslet 6519 with positive optical power. The pupil prisms 6517 deflect the incoming ray bundles to superimpose the images of the field raster elements 6509 in the reticle plane 6529. The pupil lenslets 6519 are designed together with the field lens 6521 to image the field raster elements 6509 into the reticle plane 6529. Therefore with the prismatic deflection of the ray bundles at the field raster elements 6509 and pupil raster elements 6515 an arbitrary assignment between field raster elements 6509 and pupil raster elements 6515 is possible. The pupil prisms 6517 and the pupil lenslets 6519 can also be made integrally to form a pupil raster element 6515 with positive and prismatic optical power. The field lens 6521 images the secondary light sources 6507 into the exit pupil 6533 of the illumination system forming tertiary light sources 6535 there.

Figure 2:
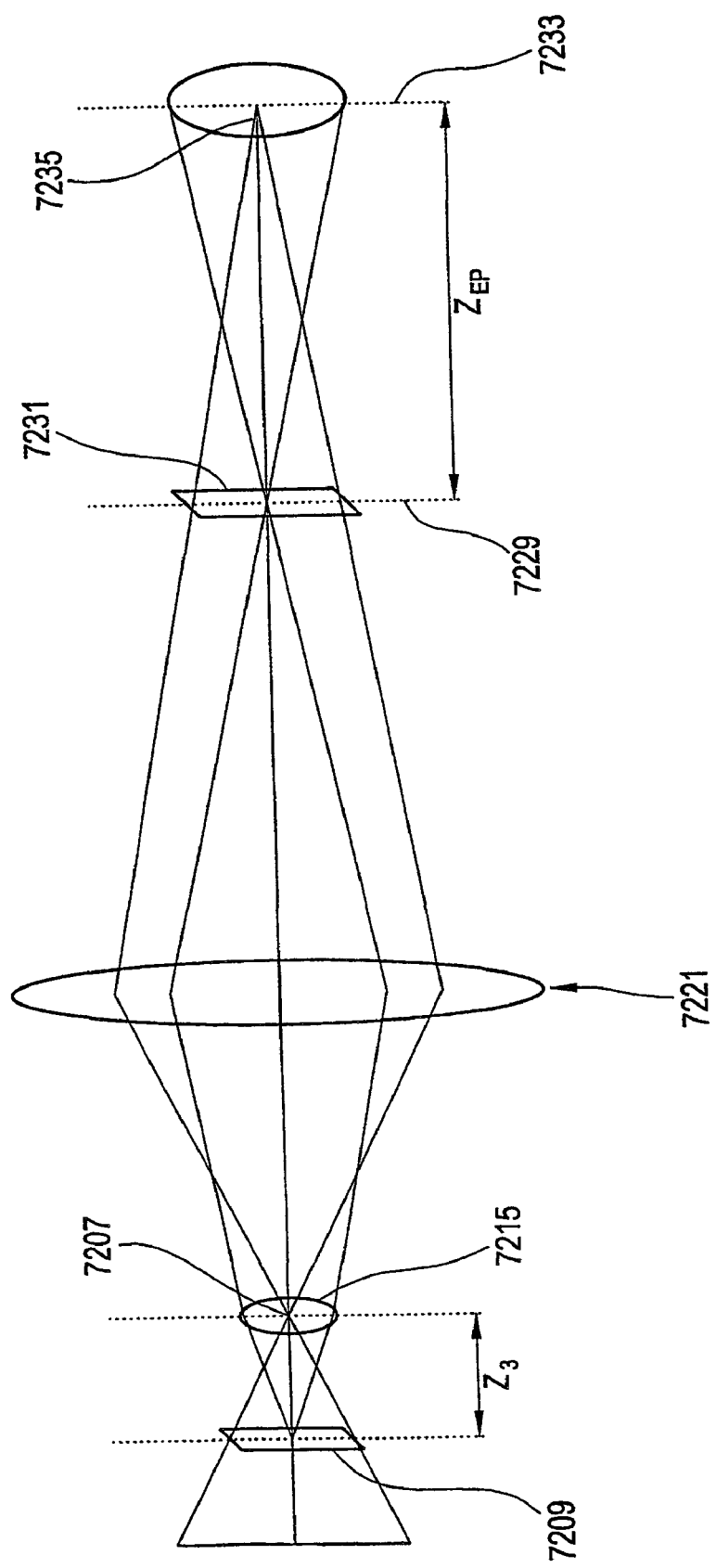
FIG. 2: A schematic view of the principal setup of the illumination system.

FIG. 2 shows in a schematic view the imaging of one field raster element 7209 into the reticle plane 7229 forming an image 7231 and the imaging of the corresponding secondary light source 7207 into the exit pupil 7233 of the illumination system forming a tertiary light source 7235. Corresponding elements have the same reference numbers as those in FIG. 1 increased by 700. Therefore, the description to these elements is found in the description to FIG. 1.

The field raster elements 7209 are rectangular and have a length $X_{FRE}$ and a width $Y_{FRE}$. All field raster elements 7209 are arranged on a nearly circular plate with a diameter $D_{FRE}$. They are imaged into the image plane 7229 and superimposed on a field 7233 with a length $X_{field}$ and a width $Y_{field}$, wherein the maximum aperture in the image plane 7229 is denoted by $NA_{field}$. The field size corresponds to the size of the object field of the projection objective, for which the illumination system is adapted to.

The plate with the pupil raster elements 7215 is arranged in a distance of $Z_3$ from the plate with the field raster elements 7209. The shape of the pupil raster elements 7215 depends on the shape of the secondary light sources 7207. For circular secondary light sources 7207 the pupil raster elements 7215 are circular or hexagonal for a dense packaging of the pupil raster elements 7215. The diameter of the plate with the pupil raster elements 7215 is denoted by $D_{PRE}$.

The pupil raster elements 7215 are imaged by the field lens 7221 into the exit pupil 7233 having a diameter of $D_{EP}$. The distance between the image plane 7229 of the illumination system and the exit pupil 7233 is denoted with $Z_{EP}$. Since the exit pupil 7233 of the illumination system corresponds to the entrance pupil of the projection objective, the distance $Z_{EP}$ and the diameter $D_{EP}$ are predetermined values. The entrance pupil of the projection objective is typically illuminated up to a user-defined filling ratio σ.

The data for a preliminary design of the illumination system can be calculated with the equations and data given below. The values for the parameters are typical for a EUV projection exposure apparatus. But there is no limitation to these values. Wherein the schematic design is shown for a refractive linear system it can be easily adapted for reflective systems by exchanging the lenses with mirrors.

The field 7231 to be illuminated is defined by a segment of an annulus. The Radius of the annulus is $R_{field}$=138 mm.

The length and the width of the segment are $X_{field}$=88 mm, $Y_{field}$=8 mm

Without the field-forming field mirror which transforms the rectangular images of the field raster elements into arc-shaped images the field to be illuminated is rectangular with the length and width defined by the segment of the annulus.

The distance from the image plane to the exit pupil is $Z_{EP}$=1320 mm.

The object field of the projection objective is an off-axis field. The distance between the center of the field and the optical axis of the projection objective is given by the radius $R_{field}$. Therefore the incidence angle of the centroid ray in the center of the field is 6°.

The aperture at the image plane of the projection objective is $NA_{wafer}$=0.25. For a reduction projection objective with a magnification ratio of $\beta_{proj}$=−0.25 and a filling ratio of σ=0.8 the aperture at the image plane of the illumination system is $$NA_{field} = \sigma \cdot \frac{NA_{wafer}}{4} = 0.05$$

$D_{EP}$=2 tan[arcsin($NA_{field}$)]·$Z_{EP}$≈2$NA_{EP}$·$Z_{EP}$≈132 mm

The distance $Z_3$ between the field raster elements and the pupil raster elements is related to the distance $Z_{EP}$ between the image plane and the exit pupil by the depth magnification α:

$Z_{EP}=\alpha \cdot Z_3$

The size of the field raster elements is related to the field size by the lateral magnification $\beta_{field}$:

$X_{field}=\beta_{field} \cdot X_{FRE}$ $Y_{field}=\beta_{field} \cdot X_{FRE}$

The diameter $D_{PRE}$ of the plate with the pupil raster elements and the diameter $D_{EP}$ of the exit pupil are related by the lateral magnification $\beta_{pupil}$:

$D_{EP}=\beta_{pupil} \cdot D_{PRE}$

The depth magnification α is defined by the product of the lateral magnifications $\beta_{field}$ and $\beta_{pupil}$:

$\alpha=\beta_{field} \cdot \beta_{pupil}$

The number of raster elements being superimposed at the field is set in a first embodiment to 200.

Another requirement is to minimize the incidence angles on the components. For a reflective system the beam path is bent at the plate with the field raster elements and at the plate with the pupil raster elements. The bending angles and therefore the incidence angles are minimum for equal diameters of the two plates:

$D_{PRE} = D_{FRE}$ $$200 \cdot X_{PRE} \cdot Y_{PRE} = 200 \cdot \frac{X_{field} \cdot Y_{field}}{\beta_{field}^2} = \frac{D_{EP}^2}{\beta_{pupil}^2} = \frac{\beta_{field}^2}{\alpha^2} D_{EP}^2$$

The distance $Z_3$ is set to $Z_3$=900 mm. This distance is a compromise between low incidence angles and a reduced overall length of the illumination system.

$$\alpha = \frac{Z_{EP}}{Z_3} = 1.47$$

Therefore $$|\beta_{field}| \approx \sqrt[4]{\frac{200 \cdot X_{field} \cdot Y_{field}}{D_{EP}^2}\alpha^2} \approx 2.05$$

$$|\beta_{pupil}| \approx \frac{\alpha}{\beta_{field}} \approx 0.7$$

$$D_{FRE} = D_{PRE} = \frac{\beta_{field}}{\alpha}D_{EP} \approx 200 \text{ mm}$$

$$X_{FRE} = \frac{X_{field}}{\beta_{field}} \approx 43 \text{ mm}$$

$$Y_{FRE} = \frac{Y_{field}}{\beta_{field}} \approx 4 \text{ mm}$$

Figure 3:
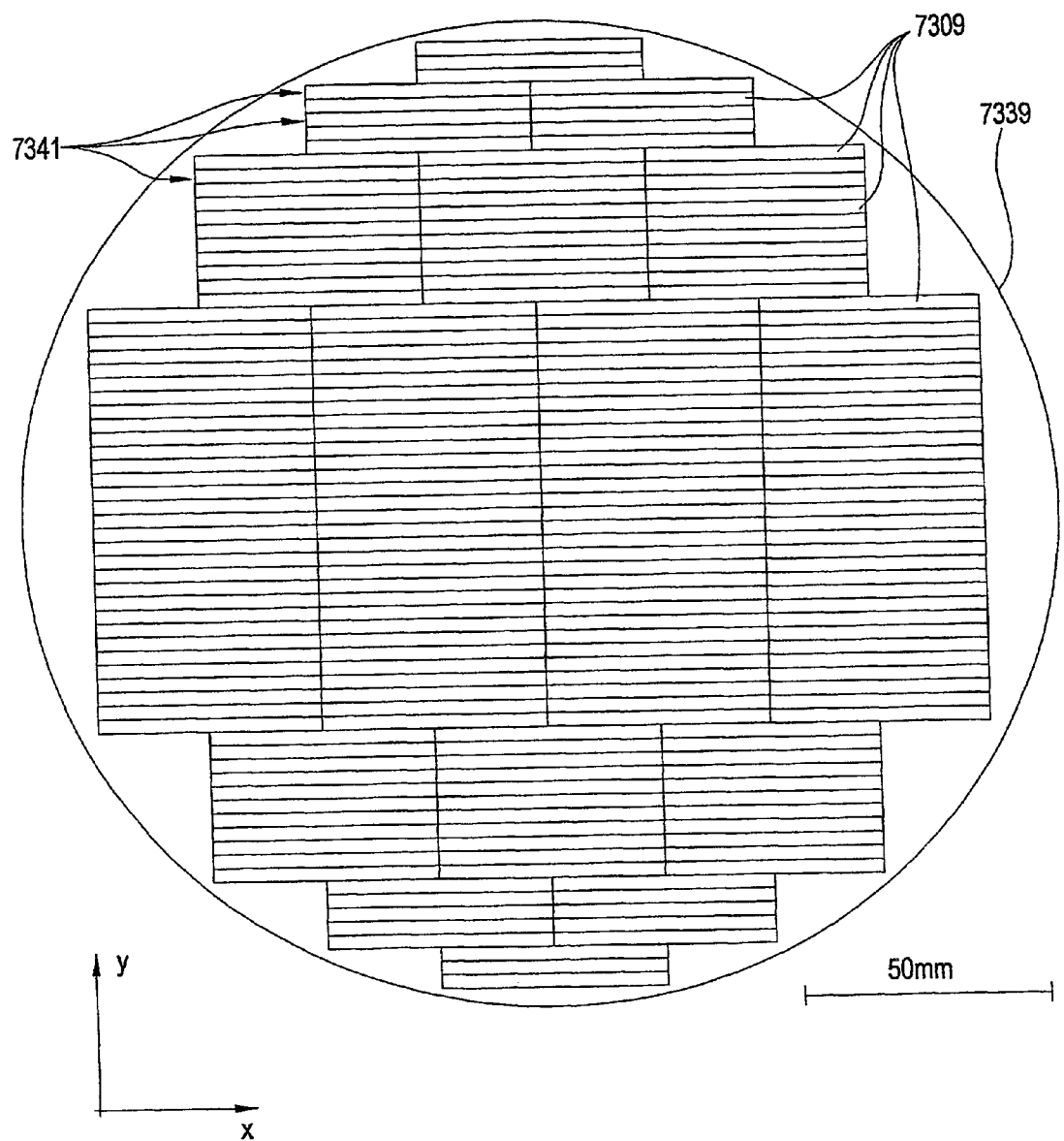
FIG. 3: A first arrangement of the field raster elements.

With these values the principal layout of the illumination system is known. In a next step the field raster elements 7309 have to be distributed on the plate as shown for a first embodiment in FIG. 3. In the embodiment shown in FIG. 3 the two-dimensional arrangement of the field raster elements 7309 is optimized for efficiency. Therefore the distance between the field raster elements 7309 is as small as possible. Field raster elements 7309, which are only partially illuminated, will lead to uniformity errors of the intensity distribution in the image plane, especially in the case of a restricted number of field raster elements 7309. Therefore according to the invention only these field raster elements 7309 are imaged into the image plane which are illuminated almost completely. FIG. 3 shows a possible arrangement of 216 field raster elements 7309. The solid line 7339 represents the border of the circular illumination of the plate with the field raster elements 7309. Therefore the filling efficiency is approximately 90%. The rectangular field raster elements 7309 have a length $X_{FRE}$=46.0 mm and a width $Y_{FRE}$=2.8 mm. All field raster elements 7309 are inside the circle 7339 with a diameter of 200 mm. The field raster elements 7309 are arranged in 69 rows 7341 being arranged one among another. The field raster elements 7309 in the rows 7341 are attached at the smaller y-side of the field raster elements 7309. The rows 7341 consist of one, two, three or four field raster elements 7309. Some rows 7341 are displaced relative to the adjacent rows 7341 to distribute the field raster elements 7309 inside the circle 7339. The distribution is symmetrical to the y-axis. Due to the distribution of the field raster elements on the plate within the border 7339 of the circular illumination of the plate in this embodiment to achieve the uniformity in the image plane no masking unit before the plate supporting the filed raster elements is necessary.

Figure 4:
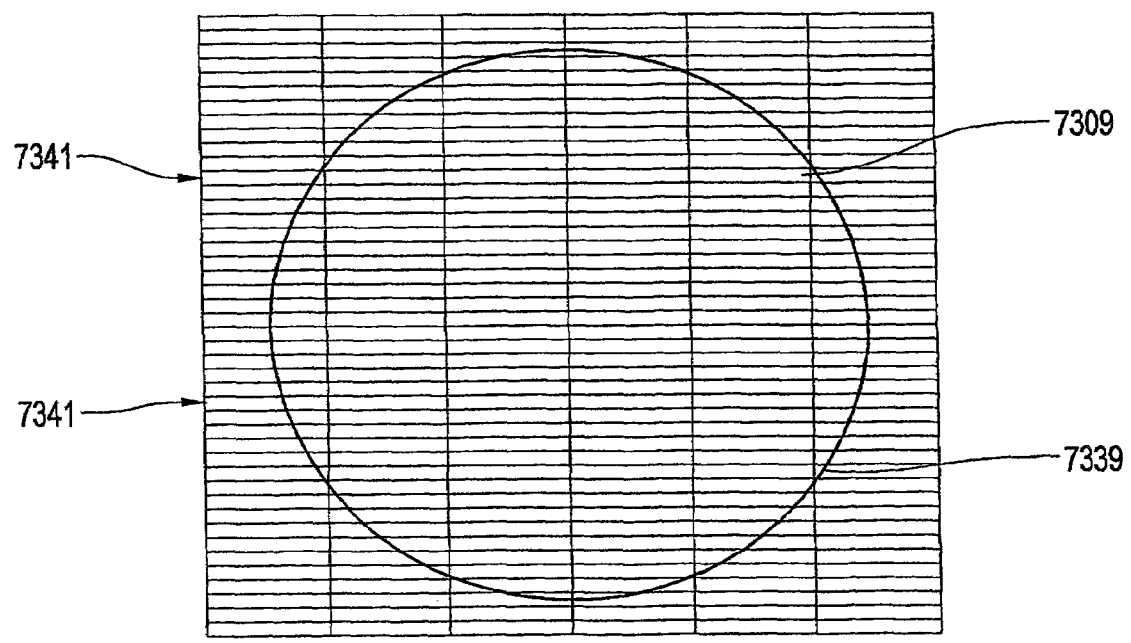
FIG. 4: A second arrangement of the field raster elements.
Figure 5:
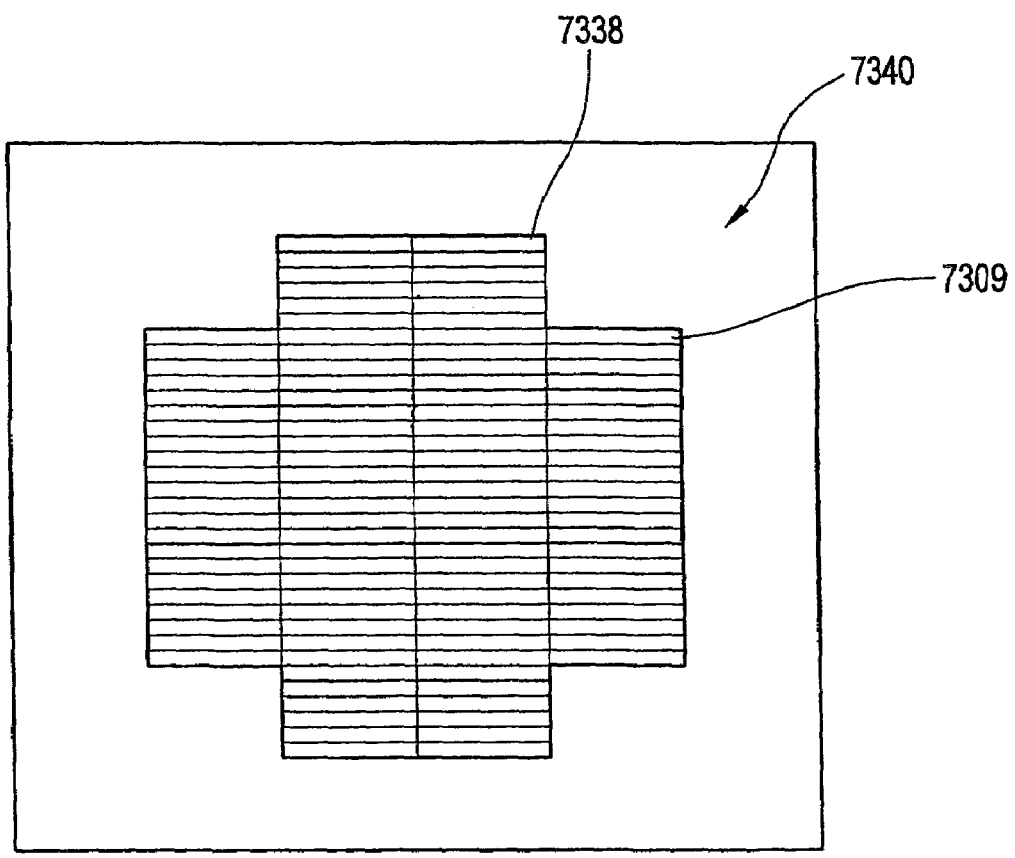
FIG. 5: A masking unit for the second arrangement of field raster elements.

FIG. 4 shows a second embodiment of the invention. The aspect ratio of the field raster elements is approximately 8:1. In contrast to the first embodiment shown in FIG. 3 the rows 7341 with field raster elements 7009 are not displaced relative to adjacent rows. Furthermore in the embodiment according to FIG. 4 only 112 field raster elements lie completely inside the circle 7339, which means that only 112 raster elements are almost completely illuminated. To achieve a uniform illumination in the image plane e.g. a masking unit 7340 as shown in FIG. 5 has to be placed in front of the plate with field raster element plates. The masking unit 7340, preferably a blade, comprises an opening 7338 which corresponds to the form of the distribution of the almost completely illuminated field raster element 7309 on the plate with field raster elements. With the masking unit 7340 a uniform illumination in the image plane could be achieved with only 112 filed raster elements. Thus a much lower number than in the first embodiment is sufficient to achieve the object of the invention. Affording a scanning integrated uniformity variation of less than 1% approximately 100 field raster elements are sufficient to compensate for a single only partially illuminated field raster element. Thus the intensity variation on the first raster elements and the number of first raster elements determines the scanning integrated uniformity. The intensity variation on the first raster elements is determined by the radiation characteristic of the light source, the imaging properties of the collector unit and the arrangement of the first raster elements. In the embodiment shown, only 95% of the first raster elements are illuminated. The intensity variation on the first raster elements is therefore 100%.

Figure 6:
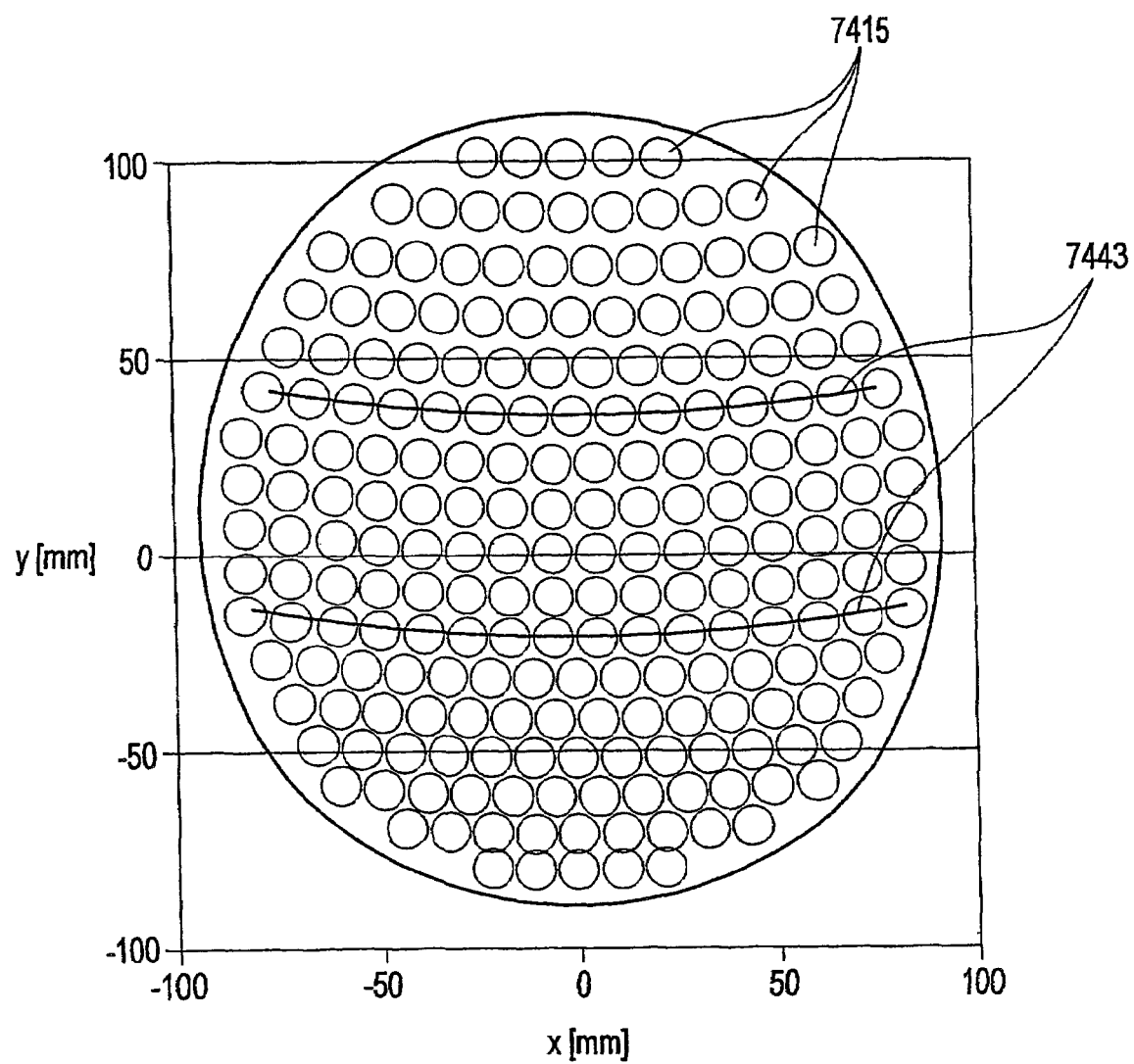
FIG. 6: An arrangement of the pupil raster elements.

FIG. 6 shows the arrangement of the pupil raster elements 7415. They are arranged on a distorted grid to compensate for distortion errors of the field lens. If this distorted grid of pupil raster elements 7415 is imaged into the exit pupil of the illumination system by the field lens a undistorted regular grid of tertiary light sources will be generated. The pupil raster elements 7415 are arranged on curved lines 7443 to compensate the distortion introduced by the field-forming field mirror. The distance between adjacent pupil raster elements 7415 is increased in y-direction to compensate the distortion introduced by field mirrors being tilted about the x-axis. Therefore the pupil raster elements 7415 are not arranged inside a circle. The size of the pupil raster elements 7415 depends on the source size or source étendue. If the source étendue is much smaller than the required étendue in the image plane, the secondary light sources will not fill the plate with the pupil raster elements 7415 completely. In this case the pupil raster elements 7415 need only to cover the area of the secondary light sources plus some overlay to compensate for source movements and imaging aberrations of the collector-field raster element unit. In FIG. 6 circular pupil raster elements 7415 are shown.

Each field raster element 7309 correspond to one of the pupil raster elements 7415 according to a assignment table and is tilted to deflect an incoming ray bundle to the corresponding pupil raster element 7415. A ray coming from the center of the light source and intersecting the field raster element 7309 at its center is deflected to intersect the center of the corresponding pupil raster element 7415. The tilt angle and tilt axis of the pupil raster element 7415 is designed to deflect this ray in such a way, that the ray intersects the field in its center.

The field lens images the plate with the pupil raster elements into the exit pupil and generates the arc-shaped field with the desired radius $R_{field}$. For $R_{field}$=138 mm, the field forming gracing incidence field mirror has only low negative optical power. The optical power of the field-forming field mirror has to be negative to get the correct orientation of the arc-shaped field. Since the magnification ratio of the field lens has to be positive, another field mirror with positive optical power is required. Wherein for apertures $NA_{field}$ lower than 0.025 the field mirror with positive optical power can be a grazing incidence mirror, for higher apertures the field mirror with positive optical power should be a normal incidence mirror.

Figure 7:
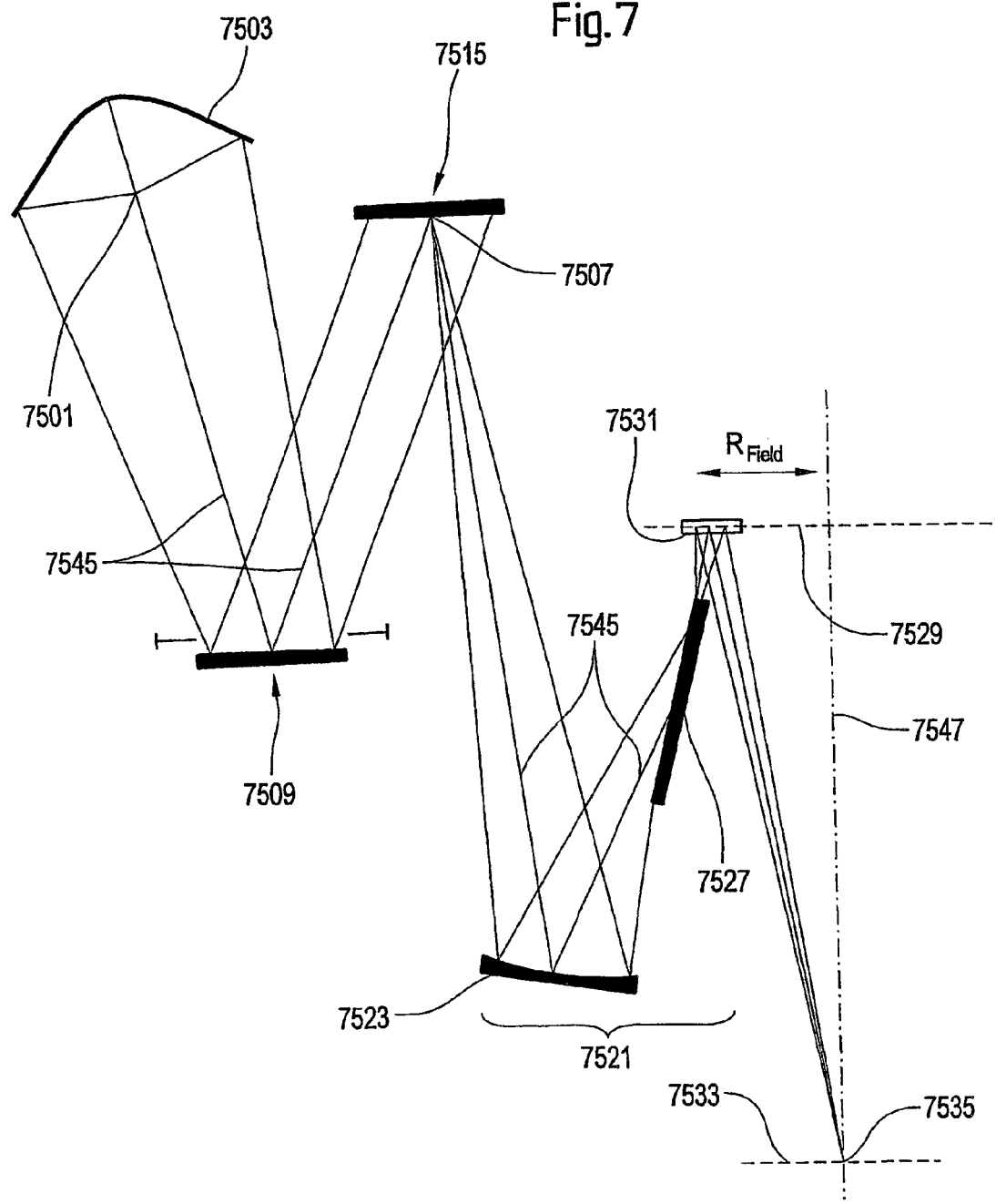
FIG. 7: A schematic view of a reflective embodiment with a field lens.

FIG. 7 shows a schematic view of a embodiment comprising a light source 7501, a collector mirror 7503, a plate with the field raster elements 7509, a plate with the pupil raster elements 7515, a field lens 7521, a image plane 7529 and a exit pupil 7535. The field lens 7521 has one normal-incidence mirror 7523 with positive optical power for pupil imaging and one grazing-incidence mirror 7527 with negative optical power for field shaping. Exemplary for the imaging of all secondary light sources, the imaging of one secondary light source 7507 into the exit pupil 7533 forming a tertiary light source 7535 is shown. The optical axis 7545 of the illumination system is not a straight line but is defined by the connection lines between the single components being intersected by the optical axis 7545 at the centers of the components. Therefore, the illumination system is a non-centered system having an optical axis 7545 being bent at each component to get a beam path free of vignetting. There is no common axis of symmetry for the optical components. Projection objectives for EUV exposure apparatus are typically centered systems with a straight optical axis and with an off-axis object field. The optical axis 7547 of the projection objective is shown as a dashed line. The distance between the center of the field 7531 and the optical axis 7547 of the projection objective is equal to the field radius $R_{field}$. The pupil imaging field mirror 7523 and the field-forming field mirror 7527 are designed as on-axis toroidal mirrors, which means that the optical axis 7545 paths through the vertices of the on-axis toroidal mirrors 7523 and 7527.

Figure 8:
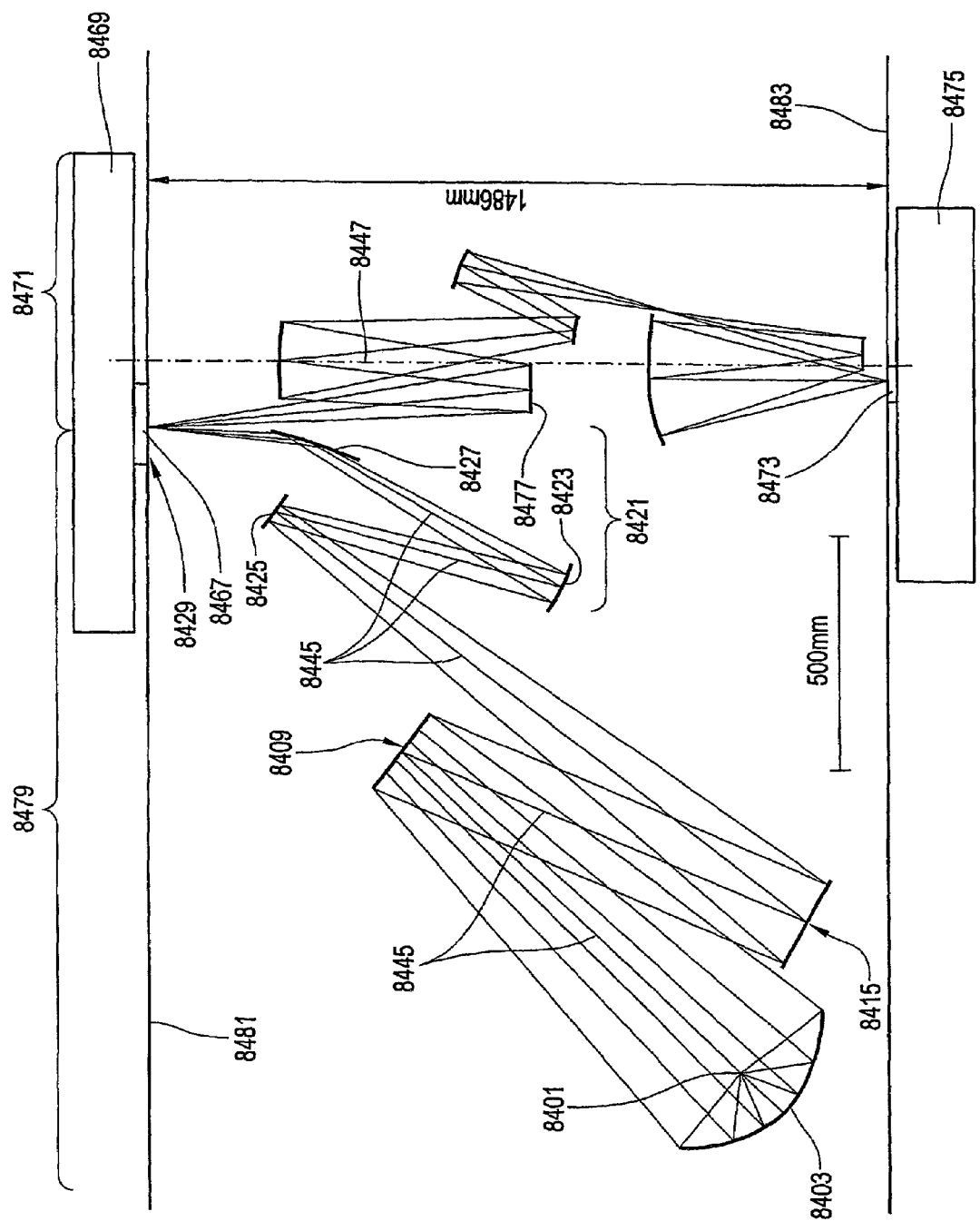
FIG. 8: A detailed view of a projection exposure apparatus.

FIG. 8 shows an EUV projection exposure apparatus in a detailed view. The illumination system is similar to the system shown in FIG. 7. Corresponding elements have the same reference numbers as those in FIG. 7 increased by 900. In contrast to the system according to FIG. 7, the system according to FIG. 8 comprises a third field mirror 8425. This makes the illumination system more compact.

Therefore, the description to these elements is found in the description to FIG. 7. In the image plane 8429 of the illumination system the reticle 8467 is arranged. The reticle 8467 is positioned by a support system 8469. The projection objective 8471 having six mirrors images the reticle 8467 onto the wafer 8473 which is also positioned by a support system 8475. The mirrors of the projection objective 8471 are centered on a common straight optical axis 8447. The arc-shaped object field is arranged off-axis. The direction of the beam path between the reticle 8467 and the first mirror 8477 of the projection objective 8471 is convergent to the optical axis 8447 of the projection objective 8471. The angles of the chief rays 8479 with respect to the normal of the reticle 8467 are between 5° and 7°. As shown in FIG. 8 the illumination system 8479 is well separated from the projection objective 8471. The illumination and the projection beam path interfere only nearby the reticle 8467. The beam path of the illumination system is folded with reflection angles lower than 25° or higher than 75° in such a way that the components of the illumination system are arranged between the plane 8481 with th reticle 8467 and the plane 8383 with the wafer 8473.

The invention claimed is:

1. An illumination system, particularly for microlithography with wavelengths $\leq 193$ nm, comprising:
   a primary light source;
   a first optical component;
   a second optical component;
   an image plane; and
   an exit pupil,
   wherein said first optical component transforms said primary light source into a plurality of secondary light sources that are imaged by said second optical component in said exit pupil,
   wherein said first optical component includes a first optical element having a plurality of first raster elements that are imaged into said image plane producing a plurality of images being superimposed at least partially on a field in said image plane, and
   wherein at least one of said plurality of first raster elements is less than or equal to about 95% illuminated, and only said plurality of first raster elements that are more than about 95% illuminated are imaged into the image plane.

2. The illumination system according to claim 1, wherein a minimum number of said plurality of first raster elements which are imaged in the image plane is given by a ratio of (a) an intensity variation at the plurality of first raster elements and (b) a scanning integrated uniformity, and
   wherein said ratio is greater than 75 and less than 300.

3. The illumination system according to claim 1, wherein said plurality of first raster elements are arranged in a two-dimensional array having an area being illuminated, and
   wherein 90% of said plurality of first raster elements are arranged completely inside said area.

4. The illumination system according to claim 1, wherein a masking unit is situated in front of the first optical element having said plurality of first raster elements.

5. The illumination system according to claim 4,
   wherein said plurality of first raster elements are arranged in a plurality of rows,
   wherein each of said plurality of rows includes at least one of said plurality of first raster elements, and
   wherein at least one of said plurality of rows is displaced relatively to an adjacent row.

6. The illumination system according to claim 1,
   wherein said plurality of first raster elements deflect a plurality of incoming ray bundles to produce a plurality of deflected ray bundles with first deflection angles, and
   wherein at least two of said first deflection angles are different from one another.

7. The illumination system according to claim 1,
   wherein said first optical component further comprises a second optical element having a plurality of second raster elements,
   wherein each of said plurality of first raster elements corresponds to one of said second raster elements, and
   wherein each of said plurality of first raster elements deflects one of a plurality of incoming ray bundles to said corresponding one of said plurality of second raster elements.

8. The illumination system according to claim 7, wherein said plurality of second raster elements and said second optical component image said corresponding plurality of first raster elements into said image plane.

9. The illumination system according to claim 7, wherein said plurality of first raster elements which corresponds to one of said plurality of second raster elements are illuminated almost completely.

10. The illumination system according to claim 7, wherein more than 95% of said plurality of first raster elements, which corresponds to one of said plurality of second raster elements, are illuminated.

11. The illumination system according to claim 7, wherein said plurality of second raster elements are concave mirrors.

12. The illumination system according to claim 1, wherein said plurality of first raster elements are rectangular and said rectangular first raster elements have an aspect ratio greater than 5:1.

13. The illumination system according to claim 12, wherein said field is a segment of an annulus, and wherein said second optical component comprises a first field mirror for shaping said field to said segment of said annulus.

14. The illumination system according to claim 13,
    wherein said first field mirror has negative optical power, and
    wherein said second optical component comprises a second field mirror with positive optical power.

15. A projection exposure apparatus for microlithography comprising:
    the illumination system of claim 1;
    a reticle being located at said image plane;
    a light-sensitive object on a support system; and
    a projection objective to image said reticle onto said light-sensitive object.

16. The illumination system according to claim 1,
    wherein a minimum number of said plurality of first raster elements which are imaged in the image plane is given by a ratio of (a) an intensity variation at the plurality of first raster elements and (b) a scanning integrated uniformity, and
    wherein said ratio is greater than 100 and less than 300.

17. An illumination system comprising:
    a primary light source that provides wavelengths $\leq 193$ nm;
    a first optical component;
    a second optical component;
    an image plane; and
    an exit pupil,
    wherein said first optical component transforms said primary light source into a plurality of secondary light sources that are imaged by said second optical component in said exit pupil,
    wherein said first optical component includes a first optical element having a plurality of first raster elements that are imaged into said image plane producing a plurality of images being superimposed at least partially on a field in said image plane,
    wherein said plurality of first raster elements that are imaged into the image plane are more than about 95% illuminated,
    wherein a minimum number of said plurality of first raster elements which are imaged in the image plane is given by a ratio of (a) an intensity variation at the plurality of first raster elements and (b) a scanning integrated uniformity, and wherein said ratio is greater than 75 and less than 300.

18. An illumination system comprising:

a primary light source that provides wavelengths $\leq 193$ nm;

a first optical component;

a second optical component;

an image plane; and an exit pupil, wherein said first optical component transforms said primary light source into a plurality of secondary light sources that are imaged by said second optical component in said exit pupil, wherein said first optical component includes a first optical element having a plurality of first raster elements that are imaged into said image plane producing a plurality of images being superimposed at least partially on a field in said image plane, wherein said plurality of first raster elements that are imaged into the image plane are more than about 95% illuminated, wherein said field is a segment of an annulus, wherein said second optical component comprises a first field mirror for shaping said field to said segment of said annulus, wherein said first field mirror has negative optical power, and wherein said second optical component comprises a second field mirror with positive optical power.

19. An illumination system comprising:

a primary light source that provides wavelengths $\leq 193$ nm;

a first optical component;

a second optical component;

an image plane;

an exit pupil, wherein said first optical component transforms said primary light source into a plurality of secondary light sources that are imaged by said second optical component in said exit pupil, wherein said first optical component includes a first optical element having a plurality of first raster elements that are imaged into said image plane producing a plurality of images being superimposed at least partially on a field in said image plane; and a mask to block imaging of a member of said plurality of first raster elements into the image plane if said member is less than about 95% illuminated.

* * * * *